United States Patent
Lauterbach et al.

(10) Patent No.: US 7,525,199 B1
(45) Date of Patent: Apr. 28, 2009

(54) PACKAGING FOR PROXIMITY COMMUNICATION POSITIONED INTEGRATED CIRCUITS

(75) Inventors: Gary R. Lauterbach, Los Altos Hills, CA (US); Danny Cohen, Pacific Palisades, CA (US); Robert J. Drost, Mountain View, CA (US)

(73) Assignee: Sun Microsystems, Inc, Santa Clara, CA (US)

( * ) Notice: Subject to any disclaimer, the term of this patent is extended or adjusted under 35 U.S.C. 154(b) by 425 days.

(21) Appl. No.: 10/851,835

(22) Filed: May 21, 2004

(51) Int. Cl.
*H01L 23/48* (2006.01)

(52) U.S. Cl. .................. 257/777; 257/723; 438/107

(58) Field of Classification Search ............... 257/777, 257/723
See application file for complete search history.

(56) References Cited

U.S. PATENT DOCUMENTS

| | | | | |
|---|---|---|---|---|
| 5,629,838 A | * | 5/1997 | Knight et al. | 361/782 |
| 6,100,593 A | * | 8/2000 | Yu et al. | 257/777 |
| 6,313,522 B1 | * | 11/2001 | Akram et al. | 257/686 |
| 6,441,496 B1 | * | 8/2002 | Chen et al. | 257/777 |
| 6,507,115 B1 | * | 1/2003 | Hofstee et al. | 257/777 |
| 6,727,115 B2 | * | 4/2004 | Van Hoff | 438/106 |
| 6,870,271 B2 | * | 3/2005 | Sutherland et al. | 257/777 |
| 6,916,719 B1 | * | 7/2005 | Knight et al. | 438/381 |
| 6,960,837 B2 | * | 11/2005 | Iadanza | 257/774 |
| 6,984,544 B2 | * | 1/2006 | Cloud et al. | 438/107 |
| 2002/0172022 A1 | * | 11/2002 | DiBene et al. | 361/761 |

OTHER PUBLICATIONS

I. Yamamoto, et al., "A Comparison of Various DC-DC Converters and Their Application to Power Factor Correction", Proceedings of the Power Conversion Conference, vol. I, pp. 128-135, Apr. 2002.
A. Dmowski, et al., "High Frequency Resonant DC/DC Current Converter", Proceedings of the IEEE International Symposium on Industrial Electronics, vol. 2, pp. 735-738,Jun. 1996.
S. Chowdhury, et al., "A MEMS Socket System for High Density SOC Interconnection", IEEE International Symposium on Circuits and Systems, vol. 1, pp. 1-657-60, May 2002.
D. Smith, et al., "A New Flip-Chip Technology for High-Density Packaging", Electronic Components and Technology Conference Proceedings, 6 pages, May 1996.

* cited by examiner

Primary Examiner—Thao X Le
Assistant Examiner—Ajay K Arora
(74) Attorney, Agent, or Firm—Osha • Liang LLP

(57) ABSTRACT

A plurality of integrated circuit packages are disposed on a substrate. The plurality of integrated circuit packages includes a first type of integrated circuit package that has an inactive side facing the substrate and an active side facing away from the substrate. The plurality of integrated circuit packages also includes a second type of integrated circuit package that has an inactive side facing away from the substrate and an active side facing the substrate. The first type of integrated circuit package and the second type of integrated circuit package are disposed such that a proximity communication enabled portion of the first type of integrated circuit package is aligned with a proximity communication enabled portion of the second type of integrated circuit package.

19 Claims, 12 Drawing Sheets

US 7,525,199 B1

PACKAGING FOR PROXIMITY COMMUNICATION POSITIONED INTEGRATED CIRCUITS

BACKGROUND OF INVENTION

A typical computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media, e.g., a floppy disk or a CD-ROM (not shown). The computing portion 12, using memory and other internal components, processes both internal data and data provided to the computing portion 12 by the user to generate data requested by the user. The generated data may be provided to the user via, for example, a display device 18 or a printer 20.

The computing portion 12 of a computer system typically includes various components such as, for example, a power supply, disk drives, and the electrical circuitry required to perform the necessary and requested operations of the computer system. As shown in FIG. 2, the computing portion 12 may contain a plurality of circuit boards 22, 24, 26, 28 on which various circuit components are implemented. For example, a computing portion designed to have enhanced sound reproducing capabilities may have a circuit board dedicated to implementing circuitry that specifically operates to process data associated with the reproduction of sound.

In FIG. 2, the components of exemplary circuit board 22 are shown. A crystal oscillator 30 provides a reference of time to various integrated circuit (IC) packages 32, 34, 36, 38, 40, 42 that are connected onto the circuit board 22. Those skilled in the art will recognize that the integrated circuit packages 32, 34, 36, 38, 40, 42 may be used to house and support various types of integrated circuits (e.g., application specific integrated circuits (ASICs), field-programmable gate arrays (FPGAs), microprocessors, and digital logic chips). The integrated circuit packages 32, 34, 36, 38, 40, 42 communicate with one another, i.e., pass data, using wires or traces of conductive material (e.g., copper or gold) (shown, but not labeled) embedded in the circuit board 22.

Those skilled in the art will recognize that the integrated circuits packages 32, 34, 36, 38, 40 shown in FIG. 2 serve to protect and support fragile and highly sensitive semiconductor dies on which actual integrated circuits are fabricated. For example, a semiconductor die having a specific type of integrated circuit fabricated thereon may be electrically packaged and housed by an integrated circuit package so as to be protected from high loads and adverse ambient conditions. Further, those skilled in the art will recognize that an integrated circuit package may be designed to provide signal and power distribution to the integrated circuit contained therein. Further still, those skilled in the art will recognize that an integrated circuit package may be beneficial for dissipating heat generated by the integrated circuit contained therein.

Still referring to FIG. 2, the integrated circuit packages 32, 34, 36, 38, 40, 42 serve as electrical interfaces between the integrated circuits fabricated on the semiconductor dies therein and the circuit board 22. As described below with reference to FIGS. 3 and 4, an integrated circuit package, such as any of the ones shown in FIG. 2, may be electrically connected to a substrate (e.g., circuit board 22 in FIG. 2) in any of a variety of ways.

FIG. 3 shows one type of an integrated circuit package referred to and known in the art as a "chip-on-board" package 50. In FIG. 3, a semiconductor die 52 having an integrated circuit fabricated thereon is disposed on a substrate 54 such that an inactive side 55 of the semiconductor die 52 faces the substrate 54 and is attached to the substrate 54 via an adhesive layer 56. Thus, an active side 58 of the semiconductor die 52 (i.e., the side of the semiconductor die 52 through which electrical activity necessary for proper operation of the semiconductor die 52 takes place) faces "up," or away from the substrate 54. The active side 58 of the semiconductor die 52 is electrically connected to the substrate 54 by wire bonds 60. The wire bonds 60 are used for power and/or signal distribution. Further, an overfill material (not shown) may be disposed over the wire bonds 60 and the semiconductor die 52 to seal, fixate, and protect the wire bonds 60 and the semiconductor die 52 from, for example, environmental dangers (e.g., dust, moisture, etc).

FIG. 4 shows another type of an integrated circuit package referred to and known in the art as a "flip-chip" package 70. In FIG. 4, a semiconductor die 72 is disposed on a substrate 74 such that an inactive side 76 of the semiconductor die 72 faces away from the substrate 74. Thus, an active side 78 of the semiconductor die 72 faces "down," or toward the substrate 74. The active side 78 of the semiconductor die 72 is electrically connected to the substrate 74 via solder balls (e.g., C4 solder balls) or bumps 80. The solder balls or bumps 80 are used for power and/or signal distribution. Further, in order to enhance the structural integrity of the flip-chip package 70, an underfill material (not shown) may be disposed in the gaps between the semiconductor die 72 and the substrate 74.

SUMMARY OF INVENTION

According to one aspect of one or more embodiments of the present invention, a computer system comprises a substrate, a first integrated circuit having an inactive side disposed facing the substrate, and a second integrated circuit having an active side disposed facing the substrate, where data is transferable between the first integrated circuit and the second integrated circuit by proximity communication.

According to another aspect of one or more embodiments of the present invention, a computer system comprises a substrate, a flip-chip type integrated circuit package disposed on the substrate, and a chip-on-board type integrated circuit package disposed on the substrate, where data is transferable between the flip-chip type integrated circuit package and the chip-on-board type integrated circuit package by at least one of capacitive coupling, inductive coupling, and optical coupling.

According to another aspect of one or more embodiments of the present invention, a computer system comprises: first interfacing means for electrically interfacing a substrate and a first integrated circuit, where the first interfacing means has an active side facing away from the substrate and an inactive side facing the substrate; second interfacing means for electrically interfacing the substrate and a second integrated circuit, where the second interfacing means has an active side facing the substrate and an inactive side facing away from the substrate; and means for transferring data between the first integrated circuit and the second integrated circuit using proximity communication.

According to another aspect of one or more embodiments of the present invention, a method for performing computer system operations comprises: propagating electrical signals between a substrate and an active side of a first integrated circuit, where the active side of the first integrated circuit faces away from the substrate, and where an inactive side of the first integrated circuit faces the substrate; propagating electrical signals between the substrate and an active side of a second integrated circuit, where the active side of the second integrated circuit faces the substrate, and where an inactive side of the second integrated circuit faces away from the substrate; and transferring data between the first integrated circuit and the second integrated circuit by proximity communication.

According to another aspect of one or more embodiments of the present invention, a method of manufacturing a portion of a computer system comprises: attaching an inactive side of a first integrated circuit package to a substrate; and attaching an active side of a second integrated circuit package to the substrate such that a proximity communication enabled portion of the second integrated circuit package is aligned with a proximity communication enabled portion of the first integrated circuit package, where the attaching comprises positioning the active side of the second integrated circuit package to face the substrate.

Other aspects and advantages of the invention will be apparent from the following description and the appended claims.

DETAILED DESCRIPTION

Figure 1:
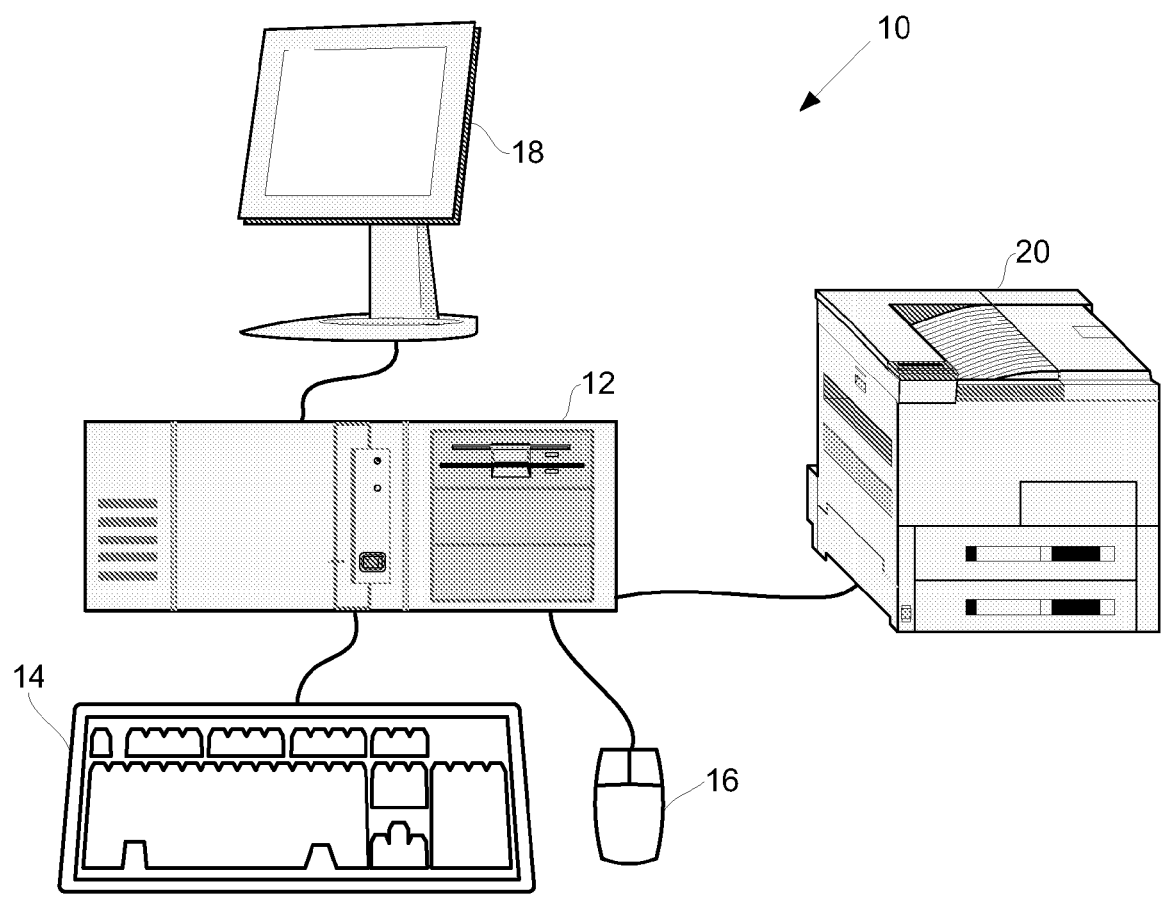
FIG. 1 shows a typical computer system.
Figure 2:
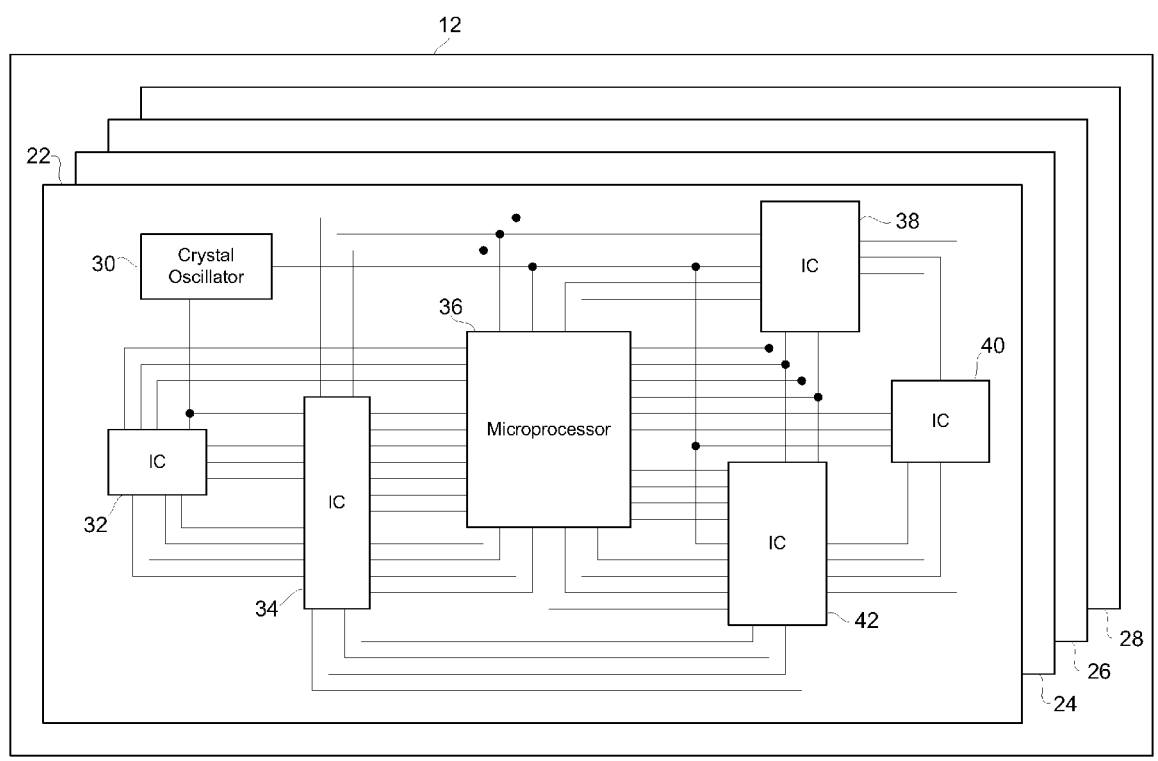
FIG. 2 shows components of a typical computer system.
Figure 3:
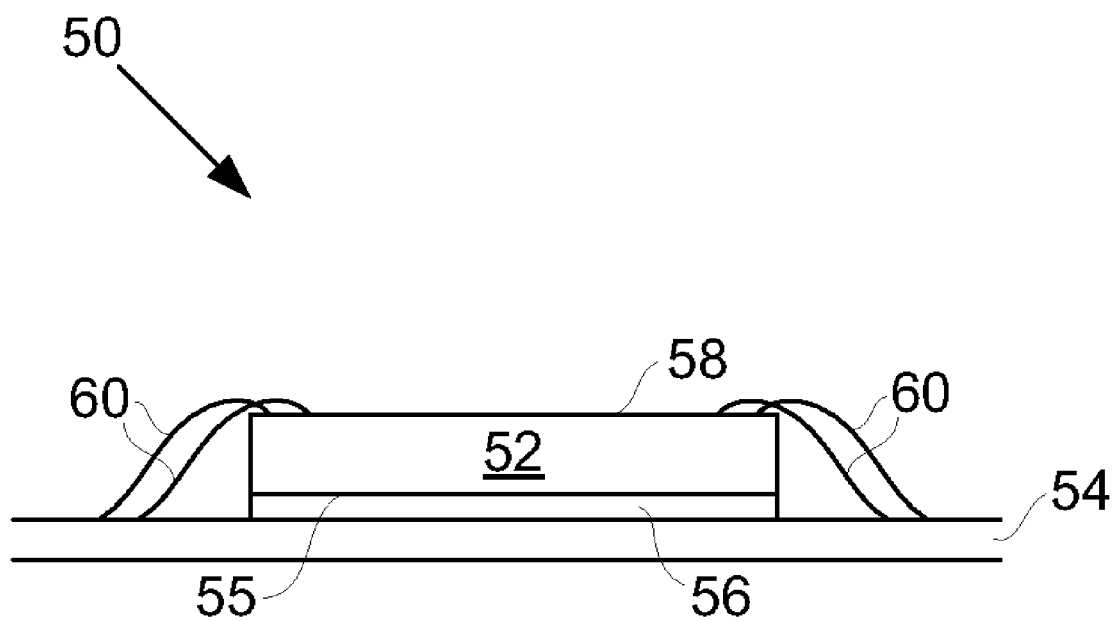
FIG. 3 shows a type of integrated circuit package.
Figure 4:
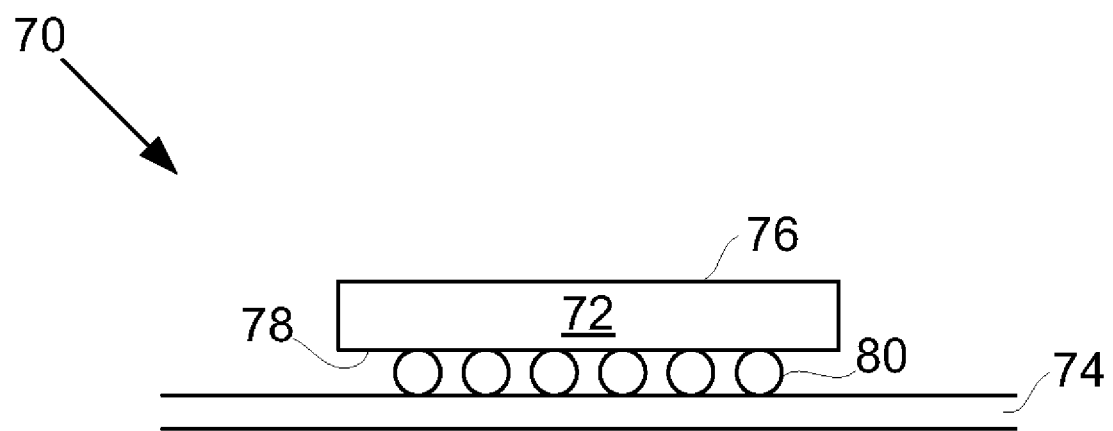
FIG. 4 shows another type of integrated circuit package.

On-chip performance (e.g., relating to operations within integrated circuit package 34 in FIG. 2) has been increasing more rapidly than off-chip communication bandwidth (e.g., amount of data that can be communicated between integrated circuit packages 36 and 42) because both on-chip transistor density and clock frequency are increasing faster than off-chip input/output (I/O) density and frequency. One reason for the differences in bandwidth may be due to off-chip wiring being, at least in some cases, orders of magnitude larger than on-chip wiring. Accordingly, the performance gap between on-chip and off-chip bandwidth makes off-chip bandwidth a performance bottleneck.

To improve data throughput at least partly in view of the differences between on-chip and off-chip bandwidth, technology referred to as "proximity communication" is used. Proximity communication is based on the observation that on-chip wires are orders of magnitude denser than off-chip wires; thereby using only on-chip wires enables far denser, higher bandwidth communication. Integrated circuits that are positioned for proximity communication are arranged such that transmitting and receiving circuits in the integrated circuits are aligned with only microns of distance between them.

Figure 5A:
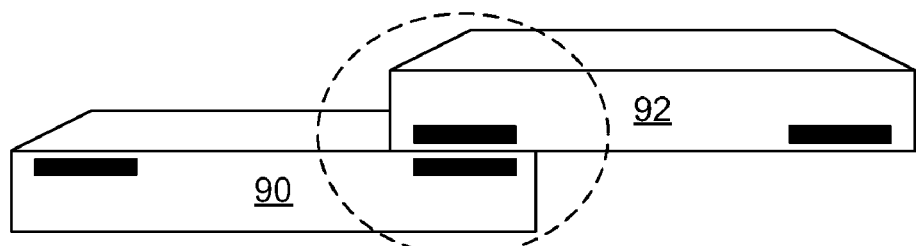
FIG. 5A shows proximity communication positioned integrated circuits.
Figure 5B:
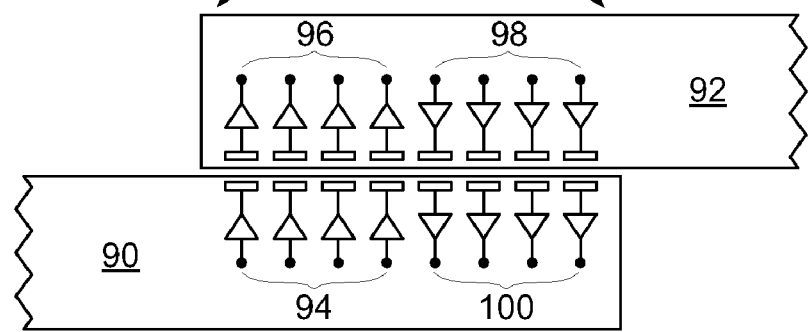
FIG. 5B shows an enlarged view of a portion of the proximity communication positioned integrated circuits shown in FIG. 5A.

FIGS. 5A and 5B show proximity communication positioned integrated circuits. In FIGS. 5A and 5B, a first integrated circuit 90 is positioned for proximity communication with a second integrated circuit 92. Using a technique referred to as "capacitive coupling," data is capable of being transferred (i) from transmitting circuits 94 of the first integrated circuit 90 to receiving circuits 96 of the second integrated circuit 92 and (ii) from transmitting circuits 98 of the second integrated circuit 92 to receiving circuits 100 of the first integrated circuit 90. By using capacitive coupling between the proximity communication positioned integrated circuits 90, 92 to transfer data, pins and wires that would otherwise be needed to transfer data between the integrated circuits 90, 92 are not required. Further, for proximity communication, the coupling may also be inductive or optical.

Figure 6:
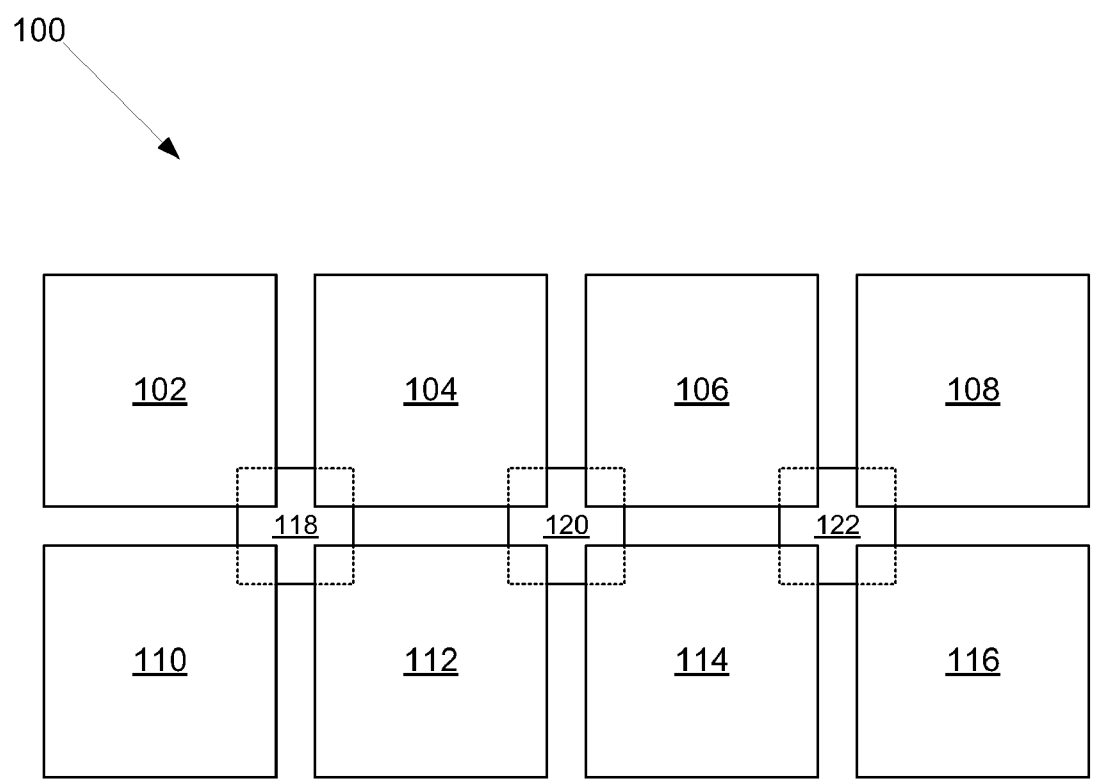
FIG. 6 shows an array of proximity communication positioned integrated circuits in accordance with an embodiment of the present invention.

FIG. 6 shows an array 100 of proximity communication positioned integrated circuits in accordance with an embodiment of the present invention. In FIG. 6, the array 100 is formed of larger integrated circuits 102, 104, 106, 108, 110, 112, 114, 116 that have corner portions overlapping with corner portions of smaller integrated circuits 118, 120, 122. The portions of overlap between the larger integrated circuits 102, 104, 106, 108, 110, 112, 114, 116 and the smaller integrated circuits 118, 120, 122 are designed to use proximity communication (as described above with reference to FIGS. 5A and 5B) for transferring data between the larger integrated circuits 102, 104, 106, 108, 110, 112, 114, 116 and the smaller integrated circuits 118, 120, 122.

Those skilled in the art will recognize that the array 100 shown in FIG. 6 may be repeated, in part or wholly, across a substrate in a computer system. Further, in one or more other embodiments of the present invention, the array 100 may be created without one or more of the integrated circuits shown in FIG. 6. For example, an array in accordance with an embodiment of the present invention may not include smaller integrated circuit 122.

Further, in one or more embodiments of the present invention, integrated circuits may be positioned in an array in which the corners of at least some of the integrated circuits do not overlap. For example, in FIG. 7, an array 160 of proximity communication positioned integrated circuits is formed of larger integrated circuits 162, 164, 166, 168, 170, 172, 174, 176, 178, 180, 182, 184 that have side portions overlapping with side portions of smaller integrated circuits 186, 188, 190, 192, 194, 196, 198, 200, 202, 204, 206, 208, 210, 212, 214, 216, 218. The portions of overlap between the larger integrated circuits 162, 164, 166, 168, 170, 172, 174, 176, 178, 180, 182, 184 and the smaller integrated circuits 186, 188, 190, 192, 194, 196, 198, 200, 202, 204, 206, 208, 210, 212, 214, 216, 218 are designed to use proximity communication (as described above with reference to FIGS. 5A and 5B) for transferring data between the larger integrated circuits 162, 164, 166, 168, 170, 172, 174, 176, 178, 180, 182, 184 and the smaller integrated circuits 186, 188, 190, 192, 194, 196, 198, 200, 202, 204, 206, 208, 210, 212, 214, 216, 218.

Figure 7:
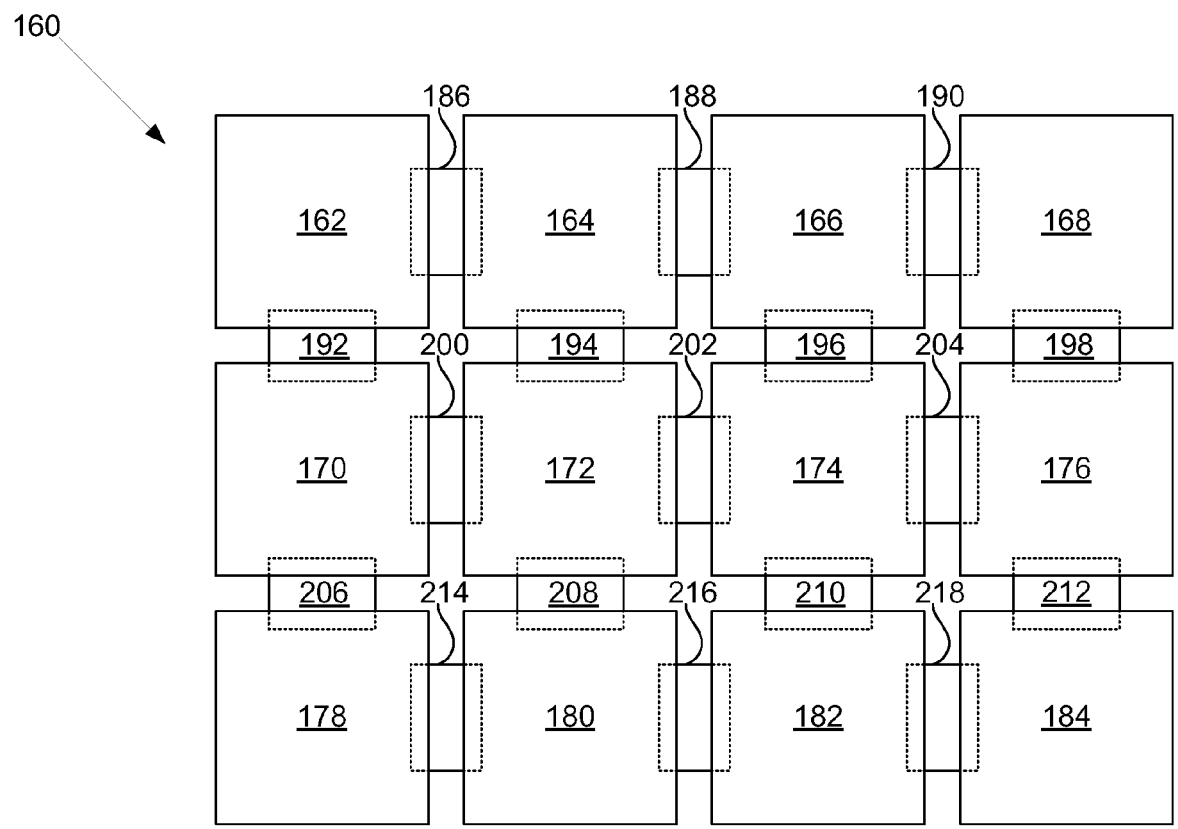
FIG. 7 shows an array of proximity communication positioned integrated circuits in accordance with another embodiment of the present invention.

Those skilled in the art will recognize that the array 160 shown in FIG. 7 may be repeated, in part or wholly, across a substrate in a computer system. Further, in one or more other embodiments of the present invention, the array 160 may be created without one or more of the integrated circuits shown in FIG. 7. For example, an array in accordance with an embodiment of the present invention may not include smaller integrated circuit 196.

Further, in one or more embodiments of the present invention, an array of proximity communication positioned integrated circuits may be implemented using a combination of the features shown in FIGS. 6 and 7. For example, an array of proximity communication positioned integrated circuits may be formed of integrated circuits that have corner regions overlapping and integrated circuits that have side portions overlapping.

Figure 8:
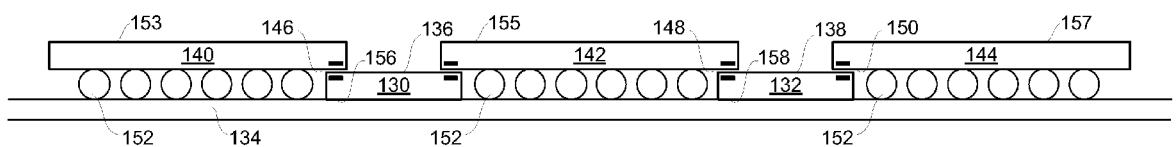
FIG. 8 shows a side view of proximity communication positioned integrated circuits in accordance with one or more embodiments of the present invention.

FIG. 8 shows a side view of proximity communication positioned integrated circuits in accordance with one or more embodiments of the present invention. In FIG. 8, smaller integrated circuits 130, 132 are connected to a substrate 134 as chip-on-board packages. In other words, the smaller integrated circuits 130, 132 are disposed with their respective active sides 136, 138 "face up" (i.e., facing away from the substrate 134). Wire bonds (not shown), connected to the active sides 136, 138 of the respective smaller integrated circuits 130, 132 and routed through gaps between larger integrated circuits 140, 142, 144, electrically connect the smaller integrated circuits 130, 132 and the substrate 134. The wire bonds (not shown) may be used for power distribution and/or input/output signaling external to an array of proximity communication positioned integrated circuits formed by integrated circuits 130, 132, 140, 142, 144.

In one or more embodiments of the present invention, relatively few wire bonds may be needed to electrically connect the smaller integrated circuits 130, 132 and the substrate 134 due to the smaller integrated circuits 130, 132 requiring less power to operate with respect to the power consumption levels associated with the larger integrated circuits 140, 142, 144.

The larger integrated circuits 140, 142, 144 are connected to the substrate 134 as flip-chip packages. In other words, the larger integrated circuits 140, 142, 144 are disposed with their respective active sides 146, 148, 150 "face down" (i.e., facing the substrate 134). Solder balls or bumps 152, disposed between the active sides 146, 148, 150 of the respective larger integrated circuits 140, 142, 144 and the substrate 134, electrically connect the larger integrated circuits 140, 142, 144 and the substrate 134. The solder balls or bumps 152 may be used for power distribution and/or input/output signaling external to an array of proximity communication positioned integrated circuits formed by integrated circuits 130, 132, 140, 142, 144.

As described above with reference to FIG. 8, (i) power to and from the larger integrated circuits 140, 142, 144 is distributed using solder balls or bumps 152 connected between the substrate 134 and the "down facing" active sides 146, 148, 150 of the larger integrated circuits 140, 142, 144, and (ii) power to and from the smaller integrated circuits 130, 132 is distributed using wire bonds (not shown) connected to the substrate 134 and the "up facing" active sides 136, 138 of the smaller integrated circuits 130, 132. However, in one or more other embodiments of the present invention, power may be distributed to and from the smaller and larger integrated circuits 130, 132, 140, 142, 144 using other types of power connections. Power may distributed using any combination of, for example, inductive coupling, capacitive coupling, wire bonds, solder balls or bumps, and conductive microsprings.

With reference to FIG. 8, in another embodiment of the present invention, instead of wire bonds, power may be distributed to and from the smaller integrated circuits 130, 132 using inductive coupling or capacitive coupling between the substrate 134 and inactive sides 156, 158 of the smaller integrated circuits 130, 132. Power may be distributed to and from the smaller integrated circuits 130, 132 using conductive pathways (e.g., vias) (not shown) that propagate power within the smaller integrated circuits 130, 132 to and from the inductive or capacitive coupling connections at the inactive sides 156, 158 of the smaller integrated circuits 130, 132.

Further, in one or more other embodiments of the present invention, power may be distributed to and from the smaller integrated circuits 130, 132 using a combination of (i) wire bonds (not shown) connected to the substrate 134 and the active sides 136, 138 of the smaller integrated circuits 130, 132 and (ii) inductive and/or capacitive coupling between the substrate 134 and the inactive sides 156, 158 of the smaller integrated circuits 130, 132.

In one or more embodiments of the present invention, the substrate 134 may be formed with recesses and/or raised portions for the disposition of proximity communication positioned integrated circuits as shown in, for example, FIG. 6. For example, in FIG. 9, which shows a side view of proximity communication positioned integrated circuits in accordance with one or more embodiments of the present invention, the substrate 134 is formed with recesses (or otherwise described as formed with raised portions). The recesses in the substrate 134 shown in FIG. 9 allow for the accommodation of the thicknesses of the solder balls or bumps 152 of the larger integrated circuits 140, 142, 144 while maintaining a "face-to-face" alignment between the larger integrated circuits 140, 142, 144 and the smaller integrated circuits 130, 132 for proximity communication.

Figure 9:
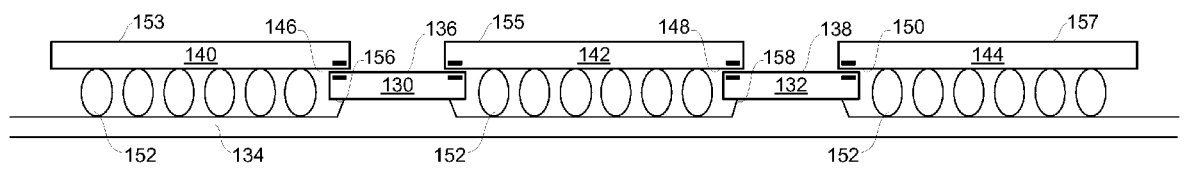
FIG. 9 shows a side view of proximity communication positioned integrated circuits in accordance with one or more embodiments of the present invention.

Still referring to FIG. 9, in one or more embodiments of the present invention, power to and from the smaller integrated circuits 130, 132 may be distributed using inductive and/or capacitive coupling between the substrate 134 and the inactive sides 156, 158 of the smaller integrated circuits 130, 132. Further, in one or more other embodiments of the present invention, power to and from the smaller integrated circuits 130, 132 may be distributed using wire bonds (not shown) connected to the substrate 134 and the active sides 136, 138 of the smaller integrated circuits 130, 132. Further, in one or more embodiments of the present invention, power to and from the smaller integrated circuits 130, 132 may be distributed using any combination of wire bonds (connected to the substrate 134 and the active sides 136, 138), inductive coupling (between the substrate 134 and the inactive sides 156, 158) and/or capacitive coupling (between the substrate 134 and the inactive sides 156, 158).

In one or more other embodiments of the present invention, the substrate 134 may be formed with recesses in other portions of the substrate 134. For example, in FIG. 10, which shows a side view of proximity communication positioned integrated circuits in accordance with one or more embodiments of the present invention, the substrate 134 is formed with recesses underneath the smaller integrated circuits 130, 132 (instead of underneath the larger integrated circuits 140, 142, 144 as shown in FIG. 9). The recesses in the substrate 134 shown in FIG. 10 allow for the accommodation of the thicknesses of conductive microsprings 159 connected between the substrate 134 and the inactive sides 156, 158 of the smaller integrated circuits 130, 132 while maintaining a "face-to-face" alignment between the larger integrated circuits 140, 142, 144 and the smaller integrated circuits 130, 132 for proximity communication. Power may be distributed to and from the smaller integrated circuits 130, 132 using conductive pathways (e.g., vias) (not shown) that propagate power within the smaller integrated circuits 130, 132 to and from the conductive microsprings 159 connected at the inactive sides 156, 158 of the smaller integrated circuits 130, 132.

Figure 10:
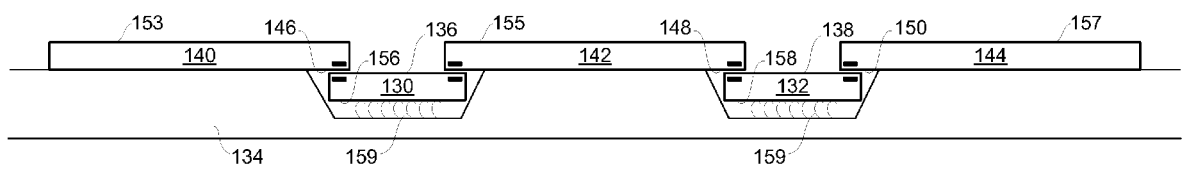
FIG. 10 shows a side view of proximity communication positioned integrated circuits in accordance with one or more embodiments of the present invention.

Still referring to FIG. 10, in one or more embodiments of the present invention, power to and from the smaller integrated circuits 130, 132 may be distributed using solder balls or bumps (not shown) (instead of conductive microsprings 159) connected between the recessed portions of the substrate 134 and the inactive sides 156, 158 of the smaller integrated circuits 130, 132. Further, in one or more embodiments of the present invention, power to and from the smaller integrated circuits 130, 132 may be distributed using a combination of conductive microsprings and solder balls or bumps.

Further, still referring to FIG. 10, in one or more other embodiments of the present invention, power to and from the larger integrated circuits 140, 142, 144 may be distributed using wire bonds (not shown) connected to the substrate 134 and inactive sides 153, 155, 157 of the larger integrated circuits 140, 142, 144. Further, in one or more other embodiments of the present invention, power to and from the larger integrated circuits 140, 142, 144 may be distributed using inductive and/or capacitive coupling between the substrate 134 and the active sides 146, 148, 150 of the larger integrated circuits 140, 142, 144. Further, in one or more embodiments of the present invention, power to and from the larger integrated circuits 140, 142, 144 may be distributed using any combination of wire bonds (connected to the substrate 134 and the inactive sides 153, 155, 157), inductive coupling (between the substrate 134 and the active sides 146, 148, 150) and/or capacitive coupling (between the substrate 134 and the active sides 146, 148, 150).

In one or more embodiments of the present invention, recesses formed in the substrate 134 under the smaller integrated circuits 130, 132 may be used to implement inductive or capacitive power coupling. For example, in FIG. 11, which shows a side view of proximity communication positioned integrated circuits in accordance with one or more embodiments of the present invention, power to and from the smaller integrated circuits 130, 132 may be distributed using inductive and/or capacitive coupling between the recessed portions of the substrate 134 and the inactive sides 156, 158 of the smaller integrated circuits 130, 132. Further, power to and from the larger integrated circuits 140, 142, 144 may be distributed using inductive and/or capacitive coupling between the raised portions of the substrate 134 and the active sides 146, 148, 150 of the larger integrated circuits 140, 142, 144.

Figure 11:
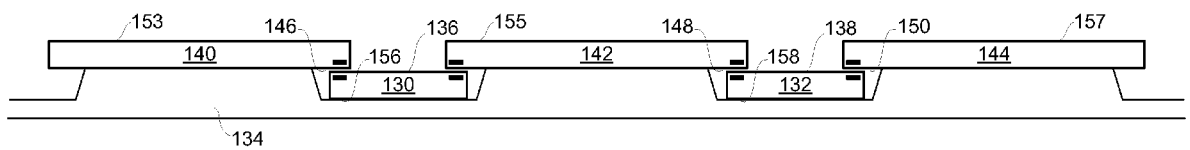
FIG. 11 shows a side view of proximity communication positioned integrated circuits in accordance with one or more embodiments of the present invention.

Still referring to FIG. 11, in one or more embodiments of the present invention, power to and from any of the smaller integrated circuits 130, 132 and the larger integrated circuits 140, 142, 144 may be distributed using wire bonds (not shown). In such embodiments, wire bonds (not shown) may be connected (i) between the substrate 134 and the inactive sides 153, 155, 157 of the larger integrated circuits 140, 142, 144 and/or (ii) between the substrate 134 and the active sides 136, 138 of the smaller integrated circuits 130, 132.

Figure 12:
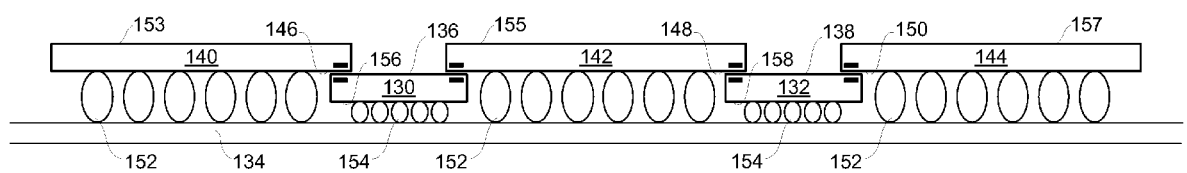
FIG. 12 shows a side view of proximity communication positioned integrated circuits in accordance with one or more embodiments of the present invention.

Referring again to an embodiment of the present invention in which the substrate 134 is planar, FIG. 12 shows a side view of proximity communication positioned integrated circuits in accordance with one or more embodiments of the present invention. In FIG. 12, (i) solder balls or bumps 152 are disposed between the substrate 134 and the active sides 146, 148, 150 of the larger integrated circuits 140, 142, 144, and (ii) solder balls or bumps 154 are disposed between the substrate 134 and inactive sides 156, 158 of the smaller integrated circuits 130, 132. Power may be distributed to and from the smaller integrated circuits 130, 132 using conductive pathways (e.g., vias) (not shown) that propagate power within the smaller integrated circuits 130, 132 to and from the solder balls or bumps 154 connected to the inactive sides 156, 158 of the smaller integrated circuits 130, 132.

Further, those skilled in the art will recognize that in FIG. 12, the thickness of the solder balls or bumps 154 is less than the thickness of the solder balls or bumps 152. Such an arrangement allows at least portions of the active sides 136, 138 of the smaller integrated circuits 130, 132 to face at least portions of the active sides 146, 148, 150 of the larger integrated circuits 140, 142, 144.

In one or more embodiments of the present invention, the selection of which type of power coupling mechanism to use in an array of proximity communication positioned integrated circuits may depend on how permanent a user desires the connections between the integrated circuits and the underlying substrate to be. For example, wire bonds and solder balls or bumps provide a relatively more permanent attachment means than do inductive coupling, capacitive coupling, and/or conductive microsprings. Thus, for example, for cases in which the user desires improved rework opportunities, inductive coupling may be chosen as the power coupling means instead of solder balls or bumps.

Advantages of the present invention may include one or more of the following. In one or more embodiments of the present invention, an array of proximity communication positioned integrated circuits may be created using existing integrated circuit packaging technologies.

In one or more embodiments of the present invention, because an array of proximity communication positioned integrated circuits may be created using existing integrated circuit packaging technologies, development and implementations costs may be reduced.

In one or more embodiments of the present invention, various power coupling means may be used to distribute power to and from the integrated circuits of an array of proximity communication positioned integrated circuits.

In one or more embodiments of the present invention, integrated circuits of an array of proximity communication positioned integrated circuits may each be connected to a planar surface (e.g., substrate 134 in FIG. 7).

In one or more embodiments of the present invention, because integrated circuits of an array of proximity communication positioned integrated circuits are each packaged having at least one inactive side, one or more heat dissipation device (e.g., heat sinks) may be selectively attached to inactive sides of the integrated circuits to promote increased heat removal.

In one or more embodiments of the present invention, due to the disposition of larger integrated circuits and smaller integrated circuits in the array of proximity communication positioned integrated circuits shown in FIG. 6, greater integrated circuit density may be achieved.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   a substrate;

a first integrated circuit (IC) having an inactive side disposed facing the substrate;
a second IC having an active side disposed facing the substrate,
  wherein a corner of the second IC overlapping with a first corner of the first IC is used to transfer data between the first IC and the second IC by proximity communication, and
  wherein the second IC is larger than the first IC;
a third IC having an active side disposed facing the substrate,
  wherein a corner of the third IC overlapping with a second corner of the first IC is used to transfer data between the first IC and the third IC by proximity communication, and
  wherein the third IC is larger than the first IC;
a fourth IC having an active side disposed facing the substrate,
  wherein a corner of the fourth IC overlapping with a third corner of the first IC is used to transfer data between the first IC and the forth IC by proximity communication, and
  wherein the fourth IC is larger than the first IC; and
a fifth IC having an active side disposed facing the substrate,
  wherein a corner of the fifth IC overlapping with a fourth corner of the first IC is used to transfer data between the first IC and the fifth IC by proximity communication, and
  wherein the fifth IC is larger than the first integrated circuit.

2. The computer system of claim 1, further comprising:
a wire bond arranged to connect an active side of the first IC and the substrate.

3. The computer system of claim 1, further comprising:
a wire bond arranged to connect an inactive side of the second IC and the substrate.

4. The computer system of claim 1,
wherein the first IC is connected to the substrate using at least one selected from a group consisting of a solder ball of a first size and a bump of the first size,
wherein the second IC is connected to the substrate using at least one selected from a group consisting of a solder ball of a second size and a bump of the second size, and
wherein the first size is different from the second size.

5. The computer system of claim 1, wherein power is provided to the first IC using the inactive side of the first IC.

6. The computer system of claim 5, wherein the power is provided by at least one of inductive coupling and capacitive coupling disposed between the inactive side of the first IC and the substrate.

7. The computer system of claim 1,
wherein the first IC is connected to the substrate using at least one microspring,
wherein the second IC is connected to the substrate using at least one selected from a group consisting of a solder ball and a bump.

8. The computer system of claim 1, further comprising:
a heat dissipation device attached to an inactive side of the second IC.

9. The computer system of claim 1, wherein the first IC is on a first level of the substrate and the second IC is on a second level of the substrate.

10. A computer system, comprising:
a substrate;
a first integrated circuit (IC) having an active side disposed facing the substrate;
a second IC having an active side disposed facing the substrate;
a third IC having an active side disposed facing the substrate;
a fourth IC having an active side disposed facing the substrate;
a fifth IC having an inactive side disposed facing the substrate,
  wherein a first side of the fifth IC overlaps with a first side of the first IC to transfer data between the fifth IC and the first IC using proximity communication, and
  wherein a second side of the fifth IC overlaps with a first side of the second IC to transfer data between the fifth IC and the second IC using proximity communication;
a sixth IC having an inactive side disposed facing the substrate,
  wherein a first side of the sixth IC overlaps with a second side of the second IC to transfer data between the sixth IC and the second IC using proximity communication, and
  wherein a second side of the sixth IC overlaps with a first side of the third IC to transfer data between the sixth IC and the third IC using proximity communication;
a seventh IC having an inactive side disposed facing the substrate,
  wherein a first side of the seventh IC overlaps with a second side of the third IC to transfer data between the seventh IC and the third IC using proximity communication, and
  wherein a second side of the seventh IC overlaps with a first side of the fourth IC to transfer data between the seventh IC and the fourth IC using proximity communication; and
an eighth IC having an inactive side disposed facing the substrate,
  wherein a first side of the eighth IC overlaps with a second side of the fourth IC to transfer data between the eighth IC and the fourth IC using proximity communication between, and
  wherein a second side of the eighth IC overlaps with a second side of the first IC to transfer data between the eighth IC and the first IC using proximity communication between.

11. The computer system of claim 10,
wherein the fifth IC is smaller than the first IC and smaller than the second IC,
wherein the sixth IC is smaller than the second IC and smaller than the third IC,
wherein the seventh IC is smaller than the third IC and smaller than the fourth IC, and
wherein the eighth IC is smaller than the first IC and smaller than the fourth IC.

12. The computer system of claim 10, further comprising:
a wire bond arranged to connect an active side of the fifth IC and the substrate.

13. The computer system of claim 10, further comprising:
a wire bond arranged to connect an inactive side of the first IC and the substrate.

14. The computer system of claim 10,
wherein the fifth IC is connected to the substrate using at least one selected from a group consisting of a solder ball of a first size and a bump of the first size,
wherein the first IC is connected to the substrate using at least one selected from a group consisting of a solder ball of a second size and a bump of a second size, and
wherein the first size is different from the second size.

15. The computer system of claim 10, wherein power is provided to the fifth IC by the inactive side.

16. The computer system of claim 15, wherein the power is provided by at least one of inductive coupling and capacitive coupling disposed between the inactive side of the fifth IC and the substrate.

17. The computer system of claim 10,
wherein the fifth IC is connected to the substrate using at least one microspring,
wherein the first IC is connected to the substrate using at least one selected from a group consisting of a solder ball and a bump.

18. The computer system of claim 10, further comprising:
a heat dissipation device attached to an inactive side of the first IC.

19. The computer system of claim 10, wherein the fifth IC is on a raised portion of the substrate.

* * * * *

UNITED STATES PATENT AND TRADEMARK OFFICE
CERTIFICATE OF CORRECTION

PATENT NO. : 7,525,199 B1 Page 1 of 1
APPLICATION NO. : 10/851835
DATED : April 28, 2009
INVENTOR(S) : Gary R. Lauterbach et al.

It is certified that error appears in the above-identified patent and that said Letters Patent is hereby corrected as shown below:

In Claim 1, Column 9 (line 21), please replace "forth" with --fourth--.

Signed and Sealed this

Sixteenth Day of June, 2009

JOHN DOLL
*Acting Director of the United States Patent and Trademark Office*